United States Patent [19]
Selwyn et al.

[11] Patent Number: 5,716,486
[45] Date of Patent: Feb. 10, 1998

[54] METHOD AND APPARATUS FOR TUNING FIELD FOR PLASMA PROCESSING USING CORRECTED ELECTRODE

[76] Inventors: Gary S. Selwyn, 14 Pine Brook Loop, Hopewell Junction, N.Y. 12533; Manoj Dalvie, 129-4 Harris Rd., Katonahm, N.Y. 10536; C. Richard Guarnieri, 11 Anarock Dr., Somers, N.Y. 10589; James J. McGill, 121 Elmcrest Dr., Fiskill, N.Y. 12524; Gary W. Rubolff, Red Coat La., Waccabuc, N.Y. 10597; Maheswaran Surendra, 31F Scenic Dr., Croton-On-Hudson, N.Y. 10520

[21] Appl. No.: 635,056

[22] Filed: Apr. 19, 1996

Related U.S. Application Data

[63] Continuation of Ser. No. 181,272, Jan. 13, 1994, abandoned.

[51] Int. Cl.⁶ .............. C23C 14/50; C23C 16/00; C23F 1/02
[52] U.S. Cl. .............. 156/345; 204/298.15; 204/298.06; 204/298.31; 204/298.32; 204/298.34; 118/723 E; 118/728
[58] Field of Search .............. 156/345; 118/723 E, 118/725, 728, 729; 204/298.06, 298.15, 298.31, 298.32, 298.34, 298.37

[56] References Cited

U.S. PATENT DOCUMENTS

| | | | |
|---|---|---|---|
| 3,730,873 | 5/1973 | Pompei et al. | 204/298 |
| 4,222,838 | 9/1980 | Bhagat et al. | 204/192 |
| 4,349,409 | 9/1982 | Shibayama et al. | 156/643 |
| 4,392,938 | 7/1983 | Harra et al. | 204/298 |
| 4,535,835 | 8/1985 | Holden | 118/728 |
| 4,632,719 | 12/1986 | Chow et al. | 156/345 |
| 4,692,727 | 9/1987 | Harada | 118/723 |
| 4,853,102 | 8/1989 | Tateishi et al. | 204/298.37 |
| 4,871,420 | 10/1989 | Alexander et al. | 204/298.31 |
| 4,950,377 | 8/1990 | Huebner | 204/298.34 |
| 4,968,374 | 11/1990 | Tsukada et al. | 156/345 |
| 4,983,253 | 1/1991 | Wolfe et al. | 204/298.37 |
| 5,014,217 | 5/1991 | Savage | 204/298.32 |
| 5,091,208 | 2/1992 | Pryor | 118/725 |
| 5,203,981 | 4/1993 | Akazawa | 156/345 |
| 5,213,658 | 5/1993 | Ishida | 156/643 |
| 5,228,940 | 7/1993 | Yoneda | 156/345 |
| 5,246,532 | 9/1993 | Ishida | 204/298.37 |
| 5,271,788 | 12/1993 | Hasegawa et al. | 204/298.37 |
| 5,298,720 | 3/1994 | Cuomo et al. | 204/298.31 |

FOREIGN PATENT DOCUMENTS

| | | |
|---|---|---|
| 0 453 780A3 | 10/1991 | European Pat. Off. |
| 2 677 043A1 | 12/1992 | France |
| 63-229719 | 9/1963 | Japan |

OTHER PUBLICATIONS

Patent Abstracts of Japan, vol. 015 No. 428 (E–1128), Oct. 30, 1991 & JP-A-03 179734 (Tokyo Electron LTD) Aug. 5, 1991.

*Primary Examiner*—Nam Nguyen
*Assistant Examiner*—Rodney G. McDonald
*Attorney, Agent, or Firm*—Perman & Green, LLP

[57] ABSTRACT

A device for reducing plasma irregularities includes an electrode assembly capable of applying an electric potential to said plasma. The electrode assembly includes a portion for reducing the plasma irregularities. The portion which reduces the plasma irregularities includes alternately a buried portion which is capable of altering the potential within the buried element, or else a conditioned portion of the surface which controls reflectivity and/or emissivity of portions of a surface of the electrode assembly differently.

30 Claims, 12 Drawing Sheets

FIG. 13
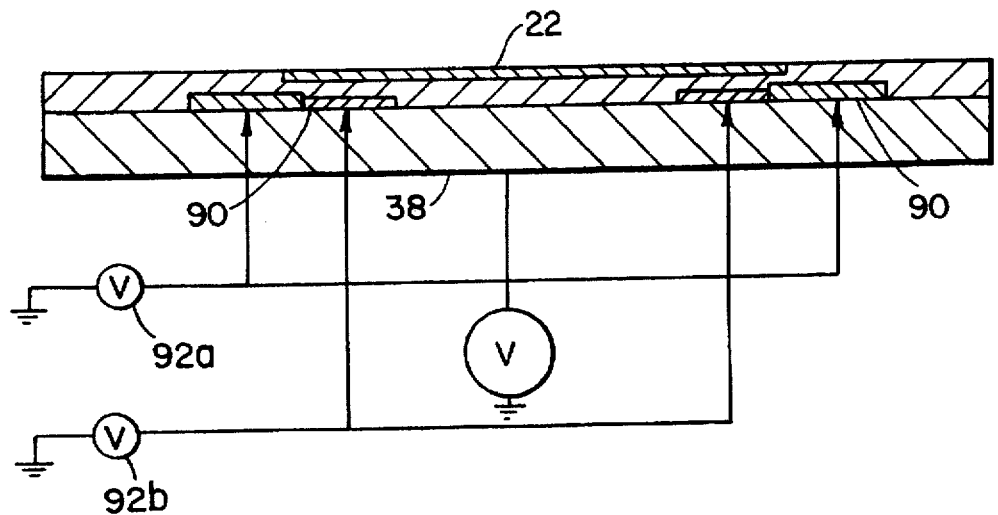
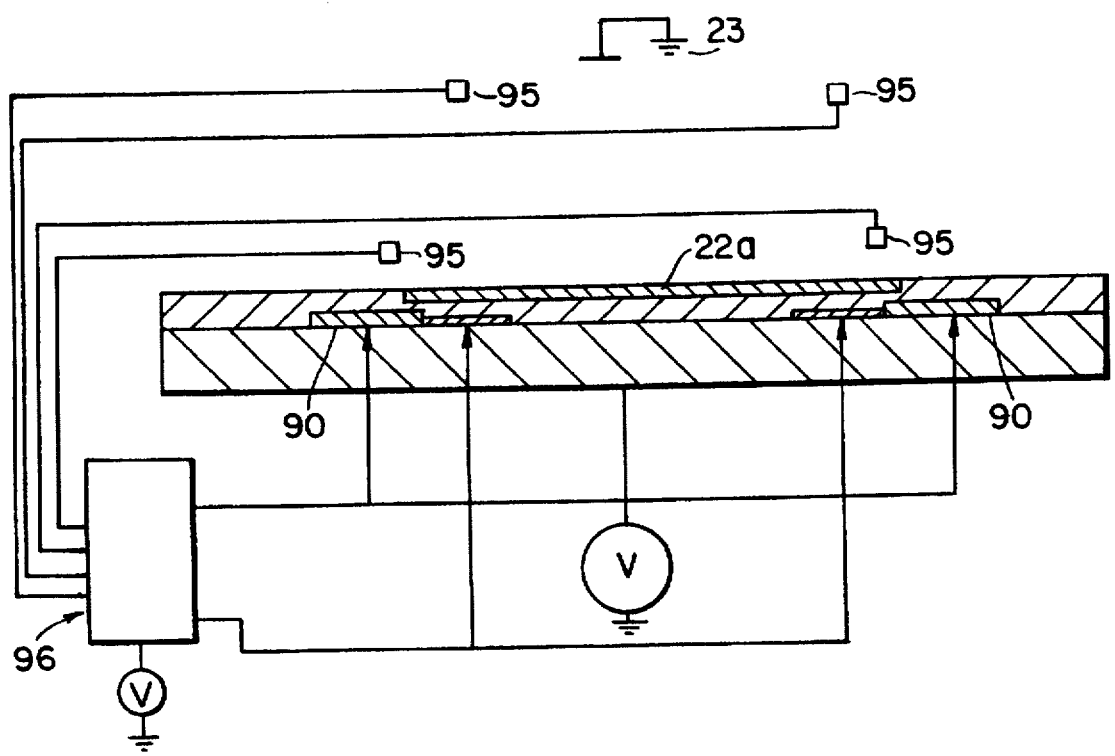
FIG. 13a

METHOD AND APPARATUS FOR TUNING FIELD FOR PLASMA PROCESSING USING CORRECTED ELECTRODE This is a continuation of application Ser. No. 08/181,272 filed on Jan. 13, 1994 and now abandoned.

FIELD OF INVENTION

The present invention relates to plasma fields, and more particularly to configuring electrodes associated with the plasma fields such that the effects of irregularities and discontinuities in the electrodes within the plasma and these effects on the sheath will be reduced.

BACKGROUND OF THE INVENTION

Plasma processing is a critical technology in modern microelectronics fabrication. It is used for etching, deposition and sputtering of thin films. Plasma processes typically account for 25–40% of the steps used in fabrication for microelectronics. Despite the wide applications of the plasma processing tools in the industry, they are among the least understood tools in the industry. One of the primary limitations of the plasma processing tools results from contamination, in which impurities are attracted to distinct portions of the plasma. A contributing cause for this problem was elucidated when it was discovered that the plasma tools themselves generate considerable contamination.

The problem of particle contamination in plasma processing has since been the subject of considerable interest. Rastered laser light scattering, as performed in laboratory and manufacturing tools, indicate that particles are most commonly trapped in the vicinity of wafer edges and clamp rings. Furthermore, Langmuir probe measurements in these systems indicate that topographic discontinuities due to wafer edges and clamp rings cause local changes in the plasma potential above the discontinuity. These perturbations in the plasma, which often appear as local maxima in potential, are very effective in trapping particles since the particles in plasmas are negatively charged. These local variations in plasma potential also cause non-uniformities in the plasma etching, deposition, or surface treatment, and also have a detrimental effect on gate oxide integrity.

Recent experimental studies have shown that material and/or topographical discontinuities on the electrode of the plasma tool induce a localized change in the plasma and sheath potential over the area of disturbance area at the plasma/sheath boundary. Typically, the disturbed area of the sheath and/or plasma results in changes of plasma properties (e.g. potential, density, emission, etc.). These disturbed regions of the plasma tend to have a higher propensity to trap contaminant particles. Furthermore, these regions also adversely affect processing uniformity of the workpiece on the electrode.

Problems with plasma non-uniformity often arise in new high density plasma tools (e.g. electron cyclotron resonance and helicon) as a result of source design. Other sources of non-uniformity include suboptimal fluid flow fields, temperature gradients and wafer pattern variations. Unintended non-uniformity is undesirable not only from the standpoint of uneven etch and deposition rates, but can also cause thin oxide damage. Such non-uniformities typically result in a certain percentage of the workpiece being unusable in the final product.

It should be evident from the above that it would be highly desirable to provide an electrode assembly which produces a plasma and sheath configuration which is substantially uniform and free of perturbations because the number of electrically charged contaminants trapped near the workpiece is thereby limited, and process uniformity is also improved. As such, a larger portion of the workpiece which is being processed with the plasma could be utilized in the final product, and a greater cost efficiency is achieved in the manufacturing process.

SUMMARY OF THE INVENTION

The present invention relates to a device for reducing plasma perturbations which includes an electrode assembly capable of applying an electric potential to said plasma. The electrode assembly includes a portion for reducing the plasma irregularities.

BRIEF DESCRIPTION OF THE DRAWING FIGURES

Figure 3:
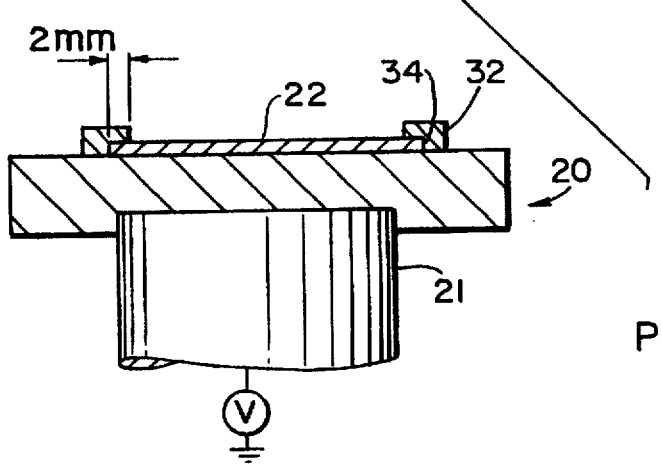
Figure 4:
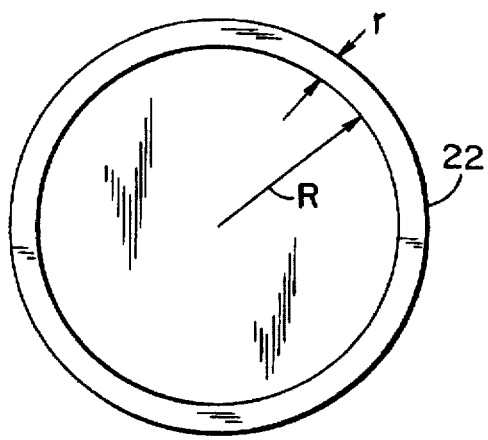
Figure 5:
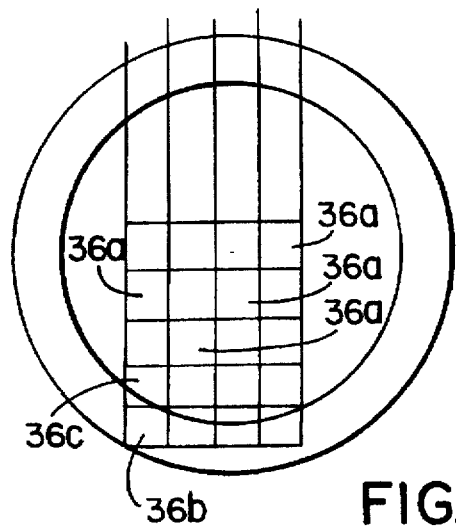
Figure 6:
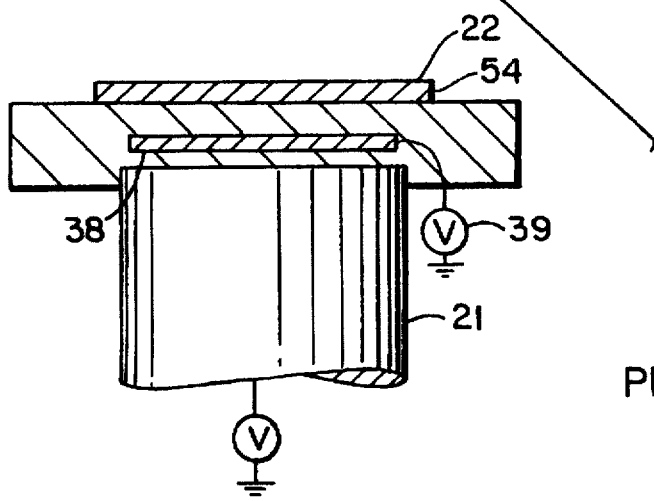
Figure 7:
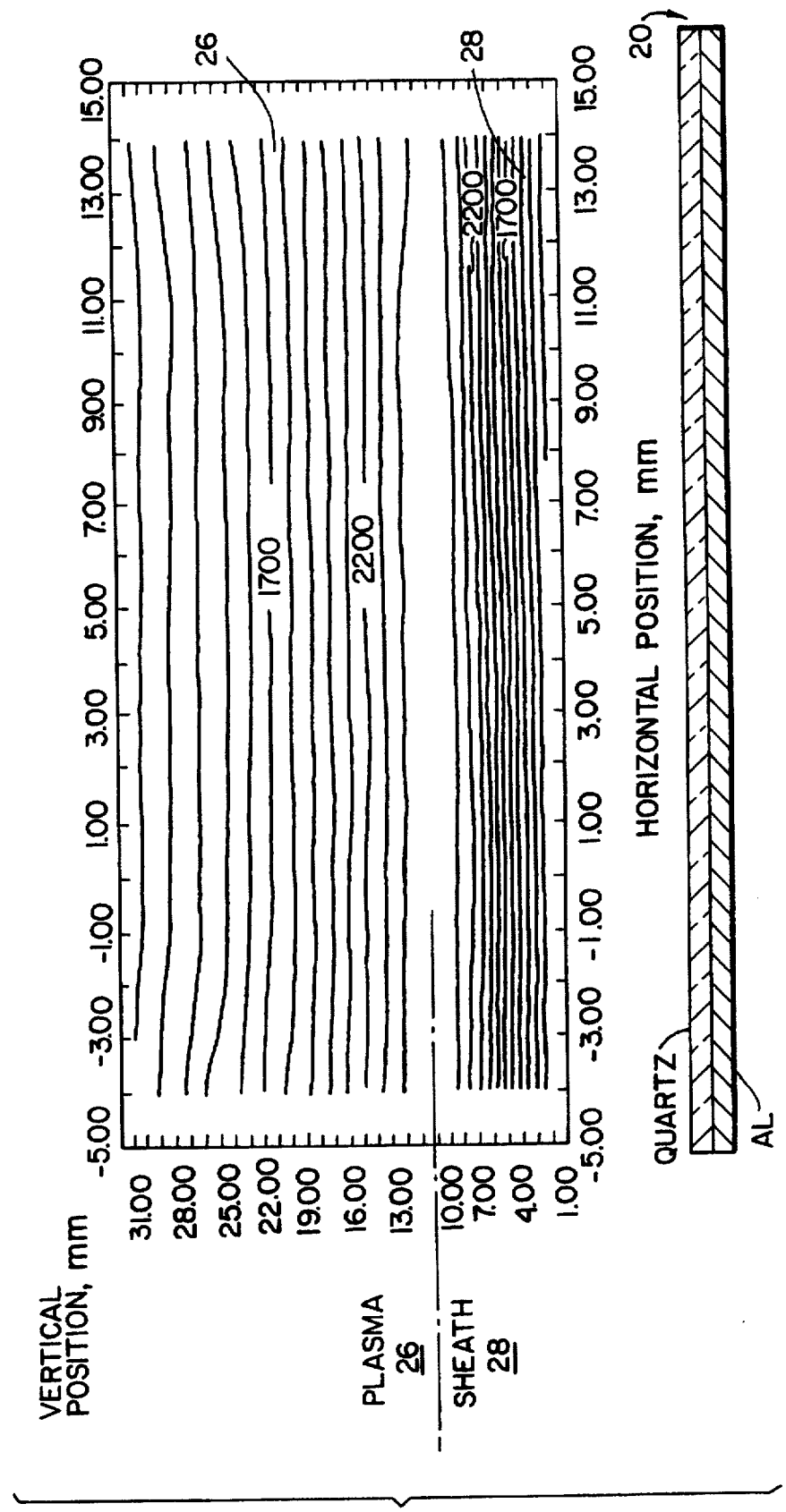
Figure 8:
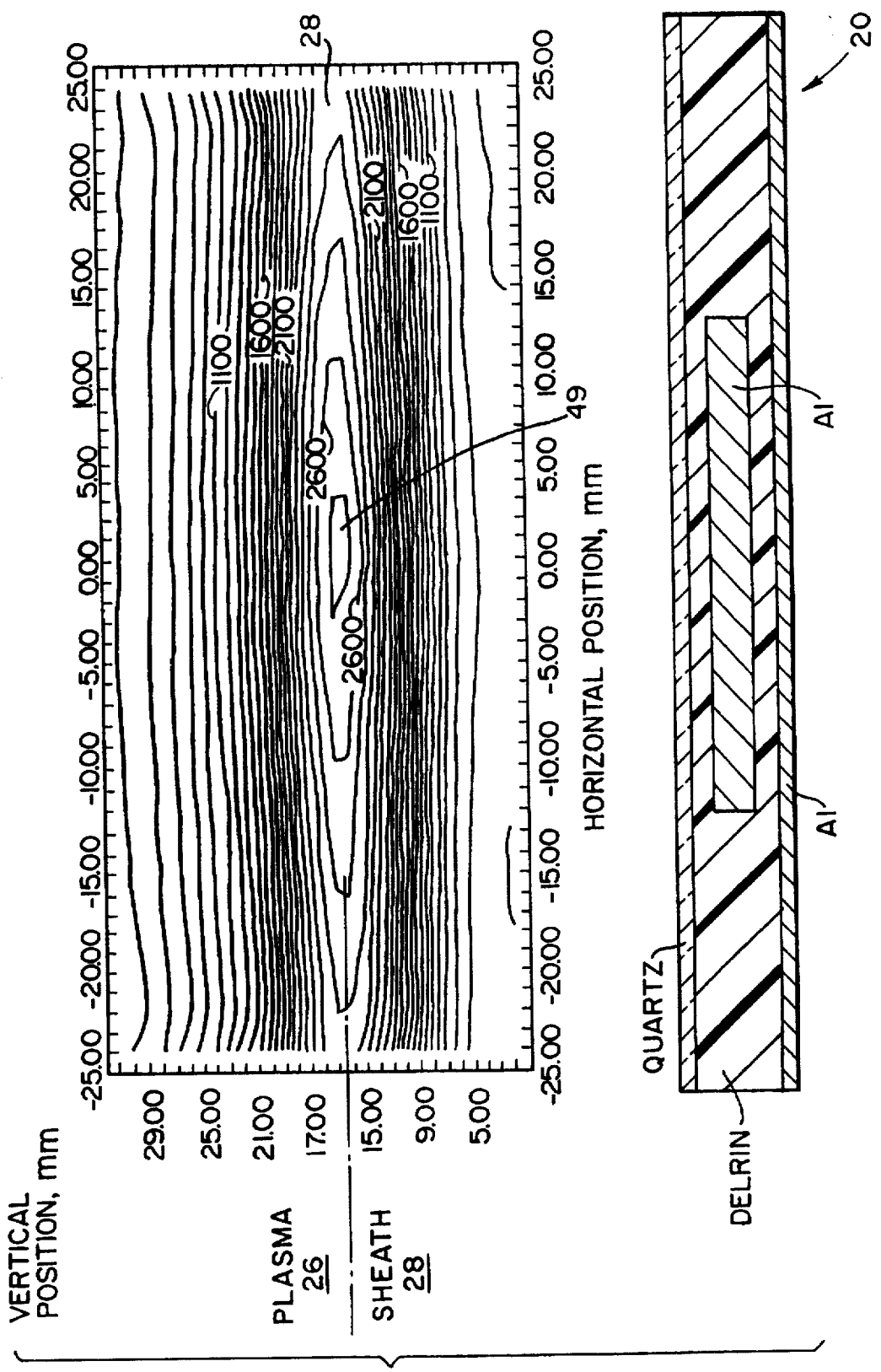
Figure 9:
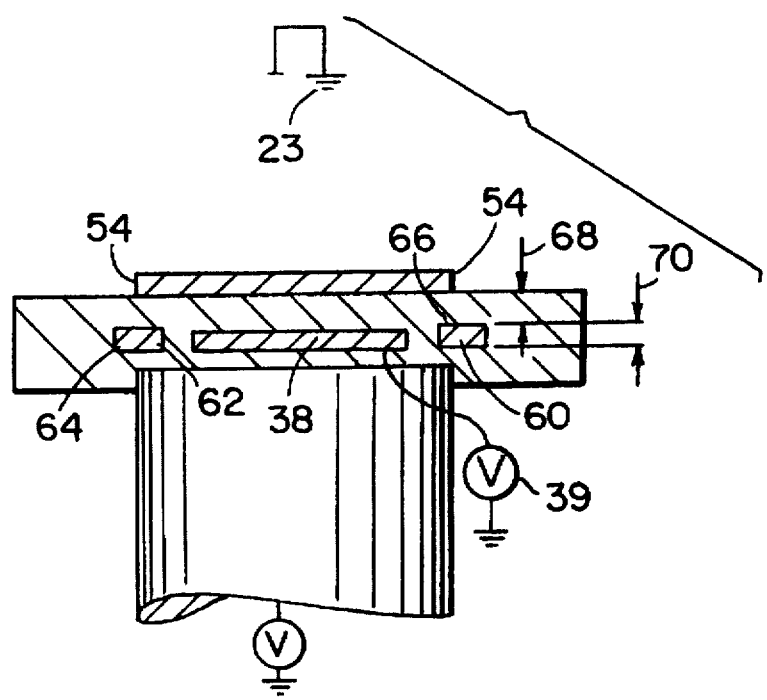
Figure 12:
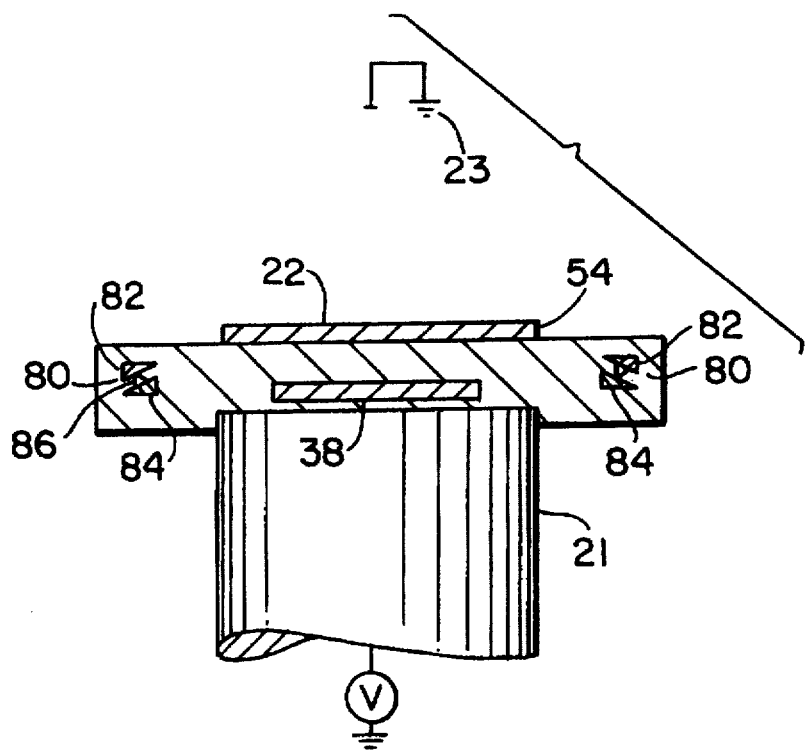
Figure 10A:
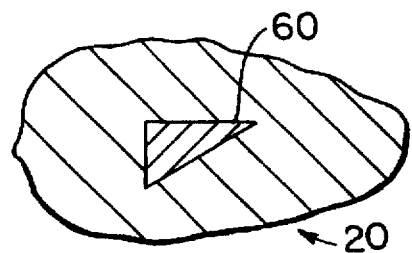
Figure 10B:
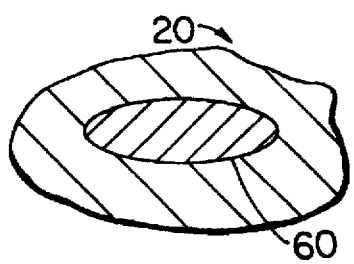
Figure 10C:
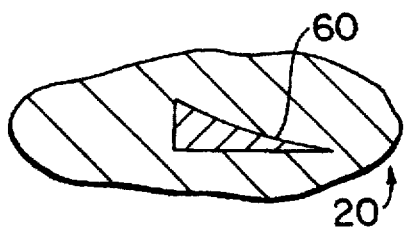
Figure 10D:
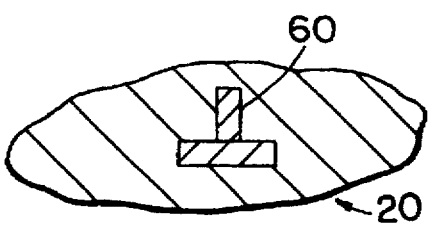
Figure 10E:
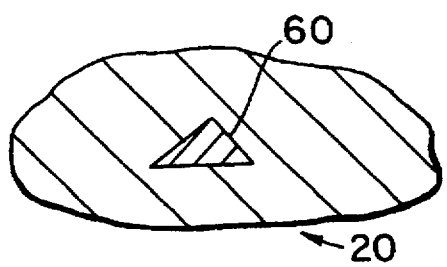
Figure 11:
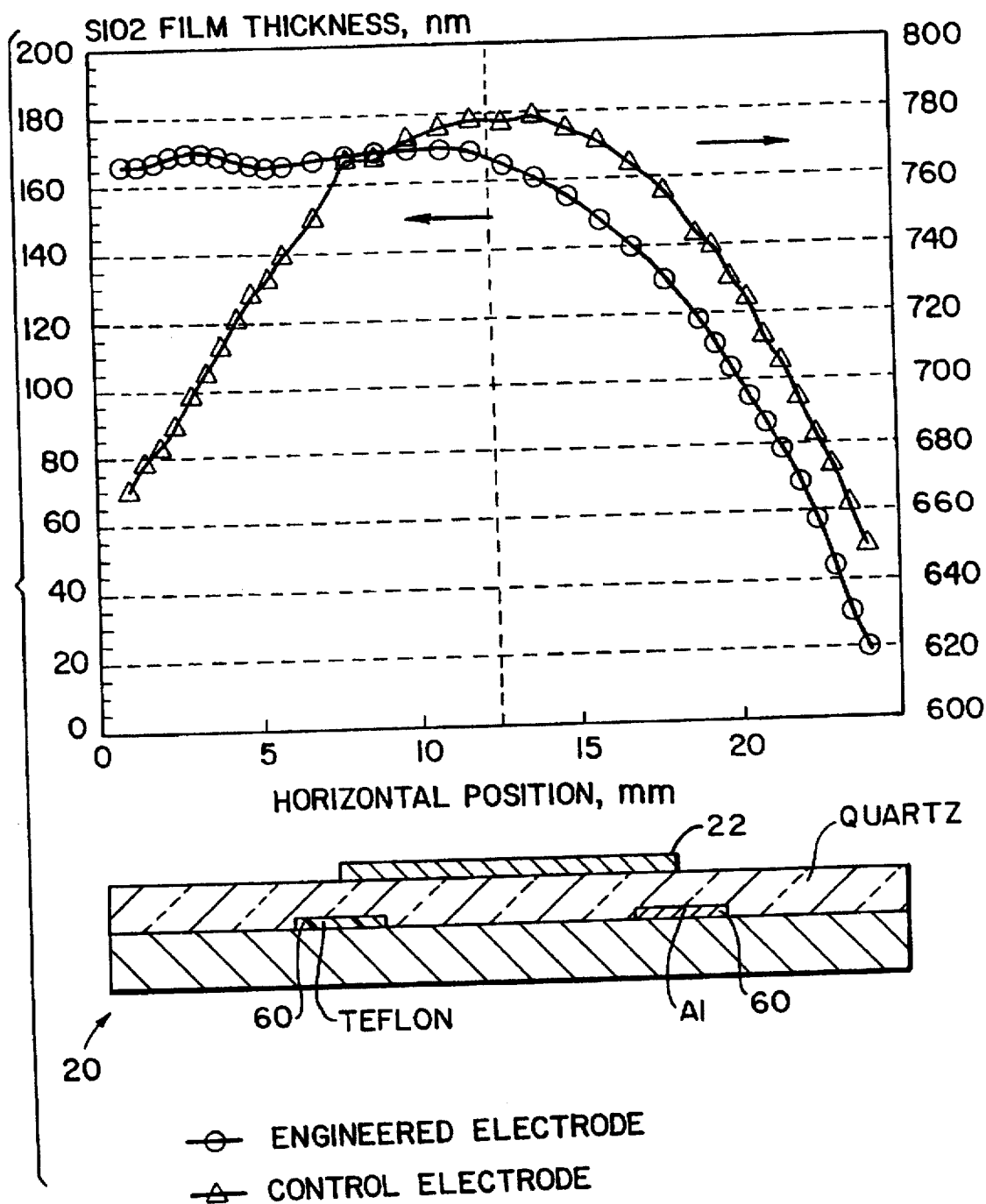
Figure 14:
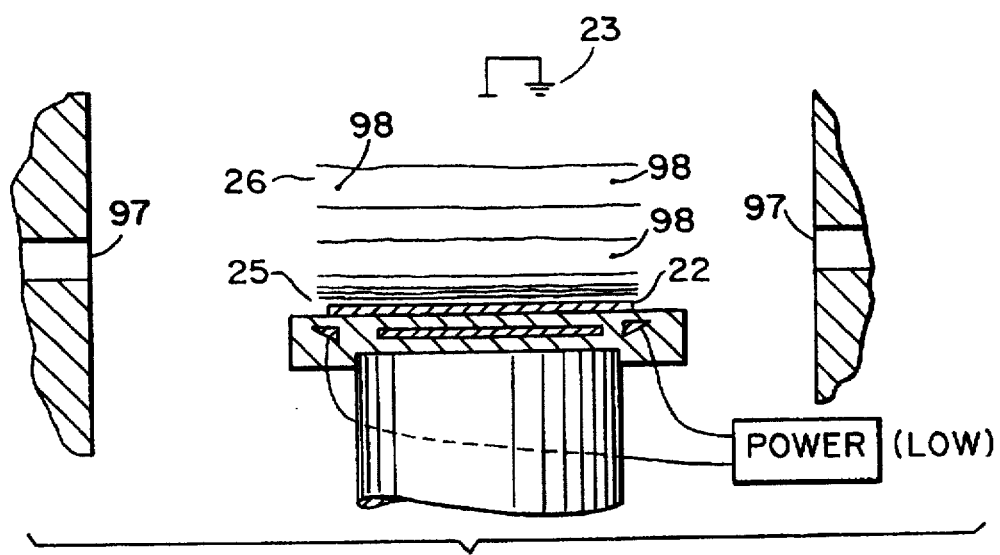
Figure 15:
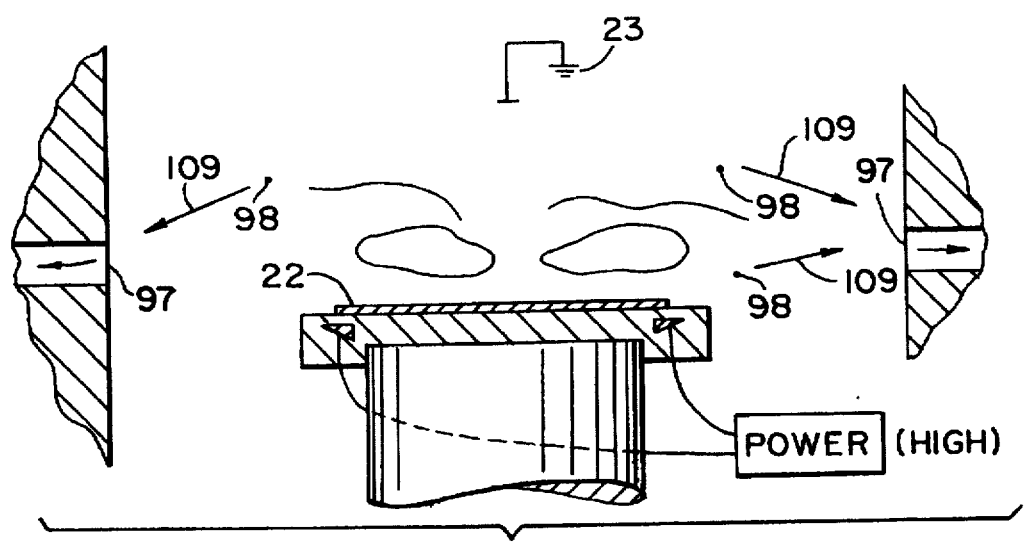
Figure 16:
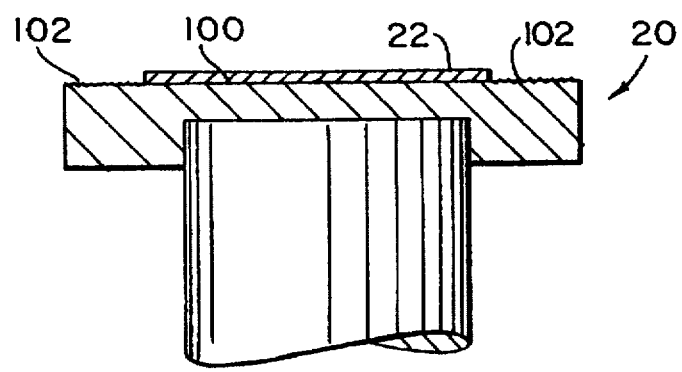
Figure 18:
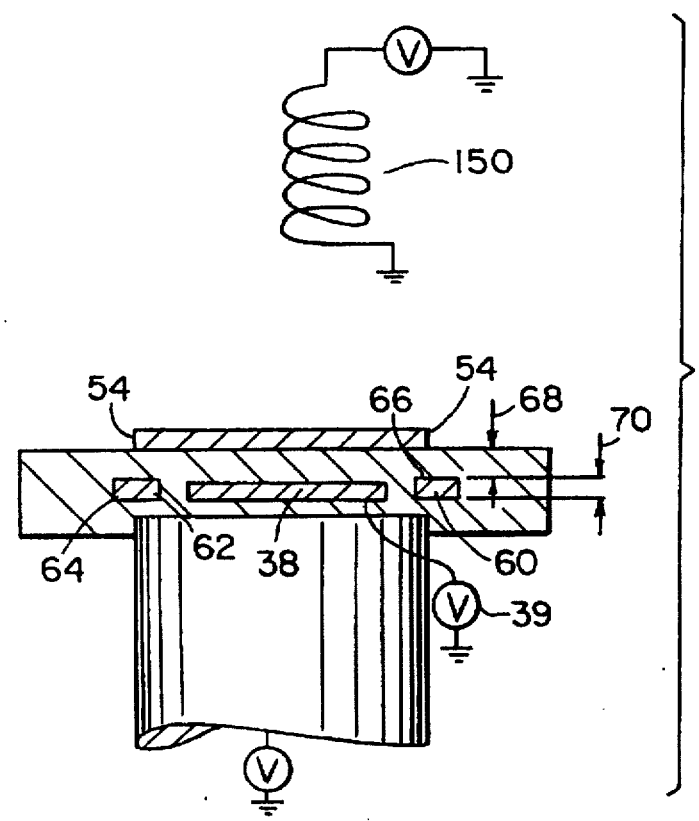
Figure 17:
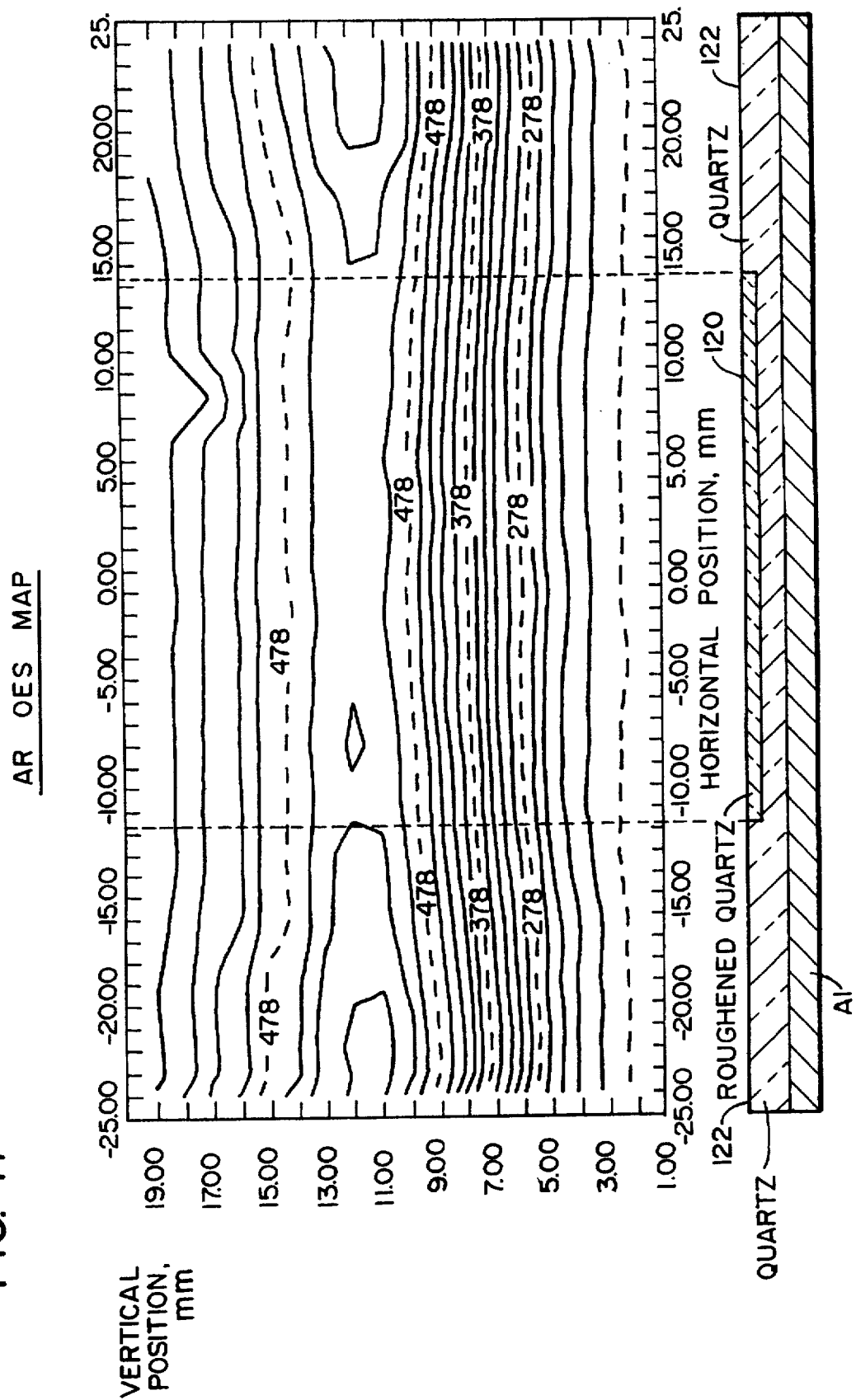
Figure 19:
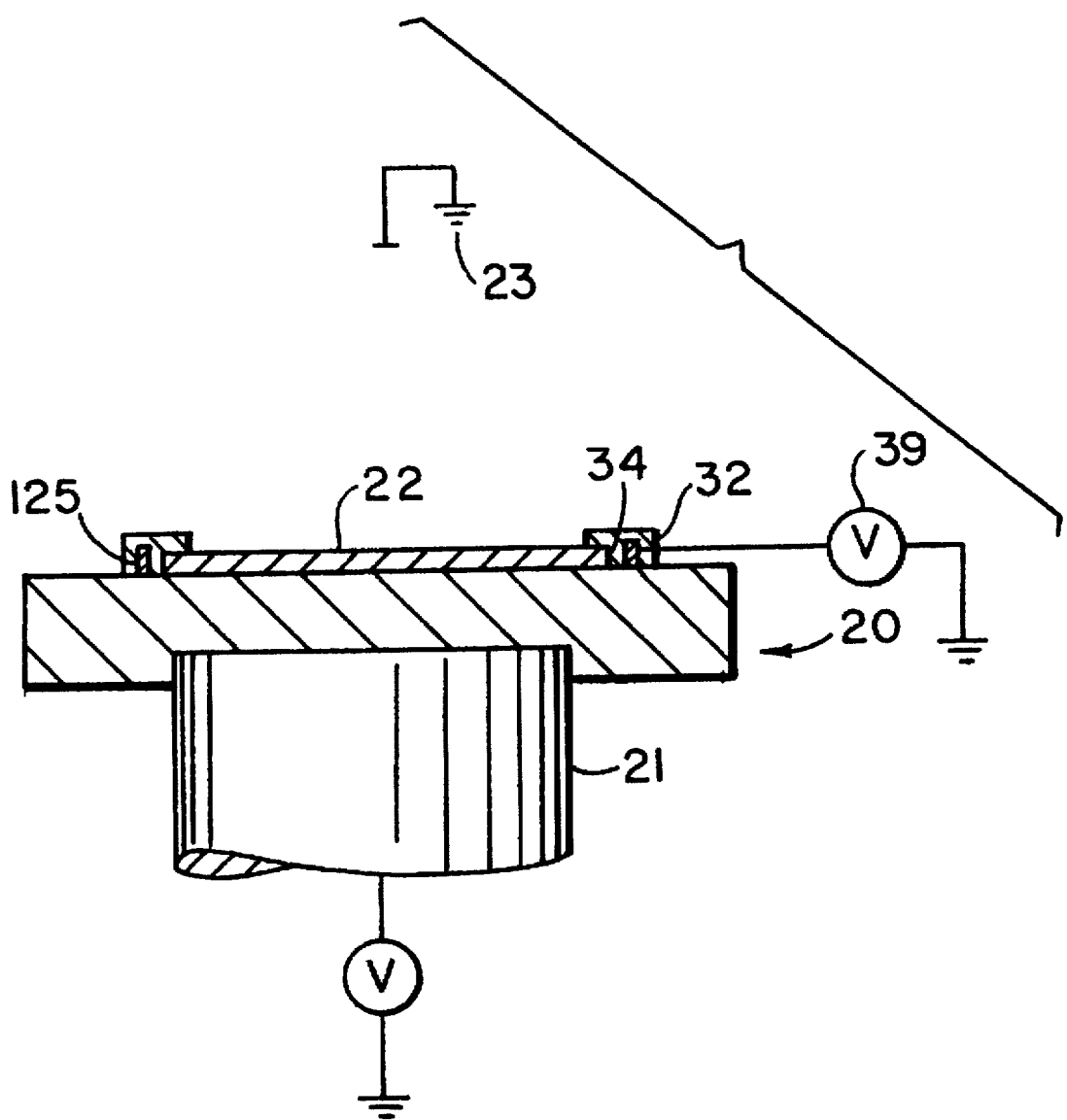

FIG. 3 illustrates a side, partially cross sectional, view of an alternate prior art embodiment of electrode assembly 20 and workpiece 22 which includes a clamp ring 32 which is configured relative to the workpiece 22;

FIG. 4 illustrates a prior art schematic of uniformity of plasma application to the workpiece 22 when the FIG. 3 device is utilized;

FIG. 5 illustrates a prior art schematic illustrating a workpiece 22 (an electronic wafer) similar to FIG. 4 which has undergone plasma processing by the device illustrated in FIG. 3, illustrating electronic chip layouts which may be formed therefrom to illustrate which chips may be utilized and which chips are unusable;

FIG. 6 illustrates a side view of an alternate prior art embodiment in which an electrostatic chuck 38 is utilized to secure the workpiece to the electrode assembly;

FIG. 7 illustrates a typical prior art plasma emission configuration which exists above an electrode assembly which has no wafer present;

FIG. 8 illustrates the plasma of FIG. 7, in which the electrode assembly is modified by aluminum inserts of one embodiment of the present invention, in which perturbations exist to such a point that hot spots are formed;

FIG. 9 illustrates one embodiment of the present invention in which passive buried elements 60 are inserted into the electrode assembly;

FIGS. 10a, 10b, 10c, 10d and 10e illustrate different configurations of buried elements 60 located similarly to that illustrated in FIG. 9;

FIG. 11 illustrates a graph demonstrating the affect of buried elements of the type illustrated in FIG. 9 and FIGS. 10 on etch uniformity of a workpiece (in this case a wafer), where a workpiece 22 is placed on the electrode assembly;

FIG. 12 illustrates another embodiment of the present invention where active buried elements are inserted into the electrode assembly;

FIG. 13 illustrates an alternate embodiment of the present invention, in which the active buried elements are controlled by the supply of a variable electric potential to the buried element;

FIG. 13a illustrates a modified version of the FIG. 13 embodiment, in which the variable electric potential to the buried element is controlled by a microelectronic controller 96 which is regulated by a plurality of sensors 95 located within said plasma;

FIG. 14 illustrates an alternate embodiment of the present invention, prior to pulses being sent through buried elements to propel the particles away from the workpiece;

FIG. 15 illustrates the FIG. 14 embodiment after the pulses have been sent through the buried element;

FIG. 16 illustrates an alternate embodiment of the present invention in which a surface 102 of the electrode assembly 20 is modified in order to alter the properties in certain regions of the plasma;

FIG. 17 illustrates one embodiment of the parent invention of an electrode assembly with adjacent smooth and roughened plasma surfaces, wherein the plasma is altered considerably by the characteristics of the surfaces;

FIG. 18 illustrates similar alternate embodiment of buried element associated with the electrode assembly to that illustrated in FIG. 9, except with an alternate primary plasma source 150; and FIG. 19 illustrates an alternate embodiment of the present invention in which the buried element is located in a focus ring.

DETAILED DESCRIPTION OF THE PRESENT INVENTION

The specific configurations, dimensions, workpiece geometries and sizes and orientations of the present invention are intended to be illustrative in scope, and are not intended to be limiting. Elements which provide similar functions in the different embodiments may be provided with similar reference characters. While many embodiments of the present invention are configured to provide a more uniform plasma, it is also within the scope of the present invention to provide an altered plasma for whatever reason.

Figure 1:
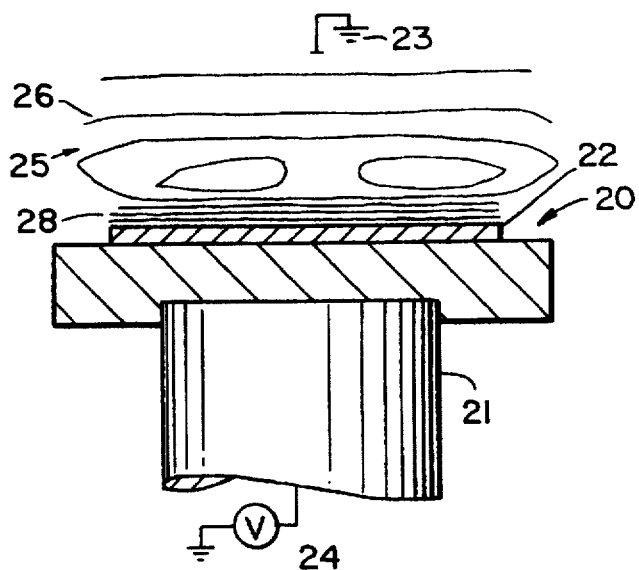
FIG. 1 illustrates a side, partially cross sectional, view of one prior art embodiment of electrode assembly 20 and the workpiece 22.
Figure 2:
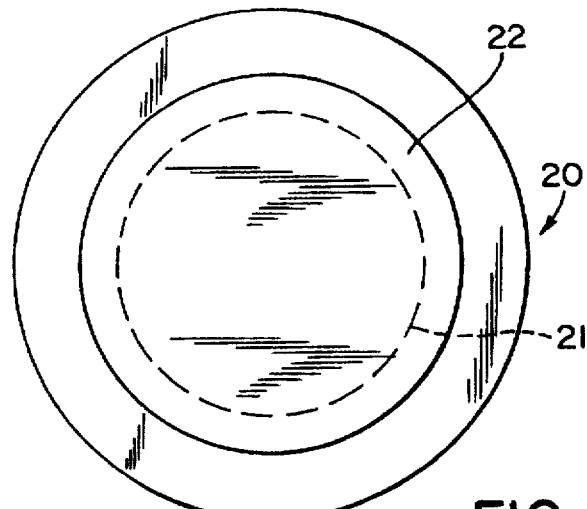
FIG. 2 illustrates a top view of the electrode assembly illustrated in FIG. 1.

FIGS. 1 and 2 illustrate a side and top view, respectively, of a prior art embodiment of electrode assembly 20 which supports a relatively light workpiece 22. The electrode assembly 20 includes an electrode 21. The workpiece 22 may be a semiconductor wafer, a magnetic storage disk, a flat panel display for a computer, or any other device which may be processed with plasma processes. The electrode assembly 20, an alternating voltage terminal 24 and a ground terminal 23 is configured to apply a very localized and selectively applied electric voltage through the workpiece 22 in a known manner. The application of the electric voltage is capable of producing and/or altering electrical region 25 consisting of a plasma 26 and an electric sheath 28 above the workpiece 22. The sheath 28 may be considered as the portion of the electrical region 25, adjacent said workpiece 22, which has a high variation in the electric field. The plasma 26 will be considered as that portion of the electrical region 25 which does not have high variation in the electric fields 28. In the remainder of the specification, the term "plasma" is intended to cover both the plasma and the sheath, unless there is a specific differentiation between the two portions of the electrical region.

A problem with the configuration illustrated in FIGS. 1 and 2 is that there is no device which secures the workpiece 22 to the electrode assembly 20. The ramification of this situation become evident when one considers the lightness of many of the workpieces 22 which plasma processing may be applied to, the amount of electric charge which is produced by the electrode assembly 20, and the precision with which the plasma methods must be applied to many of the workpieces in order to produce many of the intricate and minute design configurations on the workpiece. In all of the embodiments described in this disclosure, the workpiece 22 is illustrated in a cylindrical configuration since this is the general configuration of an electronic wafer. However, to modify the workpiece 22 and the associated structures into whatever configuration is desired is simply a design choice and does not alter the basic scope of the present invention.

In order to provide a more secure thermal and/or electrical contact between the workpiece with the electrode assembly, the prior art configuration illustrated in FIG. 3 was provided. A clamp ring 32, which is cylindrical and oriented to radially conform and secure an outer peripheral edge 34 of said workpiece 22, is secured to the electrode assembly 20. The clamp ring 32, when it is in position, may cover up to approximately 2 mm of the workpiece as illustrated in FIG. 3. The portion of the workpiece which is covered by the clamp ring 32 is not able to be processed with normal plasma techniques, and as such must be discarded after processing as useless waste. In addition, the clamp ring contributes a disturbance to the plasma such that an additional circumferential region, typically 4 to 6 mm from the inside edge of the clamp ring cannot be processed with the same uniformity as the remaining regions of the workpiece.

FIG. 4 illustrates a schematic of the uniformity of the application of the plasma onto the workpiece according to the distance from the center of the workpiece. The inner portion R represents an approximate distance, that is less than the distance from the center of the workpiece 22 to the inner edge of the clamp ring 32, which is the region of the workpiece at which the plasma is usable. The outer portion r represents that portion of the workpiece 22 which is either covered over by the clamp ring 32 or sufficiently close to the clamp ring that the plasma is unacceptably altered, and thereby does not meet the uniformity level which the inner region R has. As such, the outer portion r of the workpiece 22 is unusable.

FIG. 5 illustrates a chip layout for a workpiece 22 (in this case an electronic wafer) which has been produced by the electrode assembly 20 configuration as illustrated in FIG. 3, and as such have uniformity characteristics similar to those illustrated in FIG. 4. The inner portion R of the workpiece 22 is usable, and any layout element 36a which falls entirely within the inner region R is usable. Any layout element 36b which falls entirely within the outer portion r is unusable. In addition, any layout element 36c which falls partially within the outer portion r is also unusable. As the chips size of the layout elements become larger and larger (which is the tendency as the semiconductor and electronic industries become more and more sophisticated), then a generally a larger percentage of the layout elements fall within the latter categories of 36b and 36c, and as such, unusable. Therefore, it is desirable to provide for a larger percentage of elements which fall in the first category 36a (which are usable).

A second prior art device which provides a system for securing the workpiece 22 to the electrode assembly 20 is illustrated in FIG. 6 and utilizes an electrostatic chuck 38. While there is no dielectric device which blocks the application of the plasma similarly to the clamp ring 32 as described relative to the FIG. 3 embodiment, FIG. 6 represents another system which produces irregularities in the plasma or sheath caused by exposed edges of the wafer and differences in the materials exposed to the plasma. This too results in peripheral non-uniformities of processing. An electrostatic chuck 38 utilizes a direct current (hereafter referred to as "dc") source or field 39 which is sufficient to hold the workpiece in position by an electric potential which is analogous to static electricity (which may be properly referred to as an electrostatic clamping force). A relative dc field is produced by the dc source 39 which maintains the voltage of the electrostatic chuck 38 at a substantially fixed voltage which differs from the voltage level of the electrode 21.

Plasma Mapping

Recent investigations by the inventors of the present invention relate to spatial maps of induced emissions of plasma 26 (which as previously noted incorporates the sheath 28) above the electrode assembly 20, and have demonstrated that this is an effective manner of mapping and quantifying local changes of plasma density, and from this, the plasma potential in the plasma 26, and irregularities thereto. In particular, it has been found that non-uniform regions 49 in the plasma 26 (either a "hot or bright spot" or a "cold or dark spot" in the plasma induced emission) frequently corresponds closely with particle traps (not illustrated) which form in the vicinity of material and/or topological changes in the electrode assembly 20, such as by the insertion of the aluminum element in the electrode assembly 20 as illustrated in FIG. 8.

Plasma Configurations

FIG. 7 illustrates a plasma above a typical prior art dielectric/metal sandwich electrode assembly 20; the plasma is quite uniform and there is an absence of particle traps in the plasma. However, by modifying the electrode configuration as illustrated in FIG. 8, which is one embodiment of the present invention, the plasma density and potential is altered considerably. A bright spot 49 is created in the plasma 26 above the electrode assembly 20. The spatial map of the plasma induced emission, as illustrated in FIGS. 7 and 8, is a powerful tool in determining the location and intensity of the particle traps, and therefore provide a strong indication that a high level of particles may be attracted to the nonuniform region 49. Recent results from a two dimensional simulation of radio frequency (hereafter r-f) coupled discharges corroborates the association between bright spots and possible particle traps with discontinuities. Topological and/or material changes in the electrode assembly 20, illustrated in FIG. 8, may be configured to compensate for irregularities in the polarities which are produced by the electrode assembly 20, as described below.

Reconsidering FIG. 6, non-uniformities will appear in the plasma above an edge 54 in the workpiece 22. The edge may be a peripheral edge such as where the workpiece is a wafer or a similar member, or it may be an internal edge, for example, where the workpiece is a magnetic storage disk (not illustrated but well known in the art). Such material and topographical discontinuities from the presence of a workpiece 22 on an electrode assembly 20 which result in a non-uniform plasma (due to edge induced disturbance of the plasma and differences in electron emission/reflection coefficients of the electrode and/or the workpiece) is essentially unavoidable. Given that this situation adversely affects uniformity and particle control, it is desirable to use innovative electrode designs to negate the effect of these disturbances. A perturbation is likely to exist in the plasma above the workpiece edge 54 (whether the workpiece edge is peripheral or internal of said workpiece) or other irregularity as a result of non-uniform impedance between the electrode and the plasma. Compensating for such discontinuities or perturbations in any of the above configurations in the workpieces, or any other discontinuities which may be produced in close proximity to an electrode assembly 20, is one of the primary goals of the present invention and would greatly assist in plasma processing techniques. These improvements will result in a considerable increase in yield from such techniques. As such, the invention should produce a uniform plasma such as illustrated in FIG. 7, except that the workpiece is situated on the electrode assembly 20. producing a more uniform plasma improves process uniformity and reduces the number of contaminant particles on the workpiece.

Compensating for Plasma Irregularities for Reducing Particle Traps

The above mentioned plasma perturbations and discontinuities may be greatly limited by the addition of a subsurface element placed below the wafer edge or irregularity to equalize the r-f coupling across the electrode. The element can be actively tuned for a specific plasma-sheath structure by, for example, using piezoelectric materials to control the spacing of a vacuum gap in the electrode and thus spatially tuning the propagation of the r-f power through the electrode.

There are two basic types of tuning devices illustrated herein which compensate for plasma irregularities. These two types are illustrated as modifications of the embodiment of prior art illustrated in FIG. 6, even though it is to be understood that these modifications could be easily applied to any of the other described prior art embodiments, or any other known embodiment in the field by a person having ordinary skill in the art.

The first type of embodiments illustrated herein is referred to as the "inserted embodiments" and is illustrated in FIGS. 9 to 15, 18 and 19. In these embodiments, a separate element is attached to, or embedded within or about, the electrode assembly 20 in order to tune the plasma above the electrode assembly. The second embodiment type of tuning elements are referred to as "conditioning embodiments"; and represents those embodiments in which an electrode surface 100 of the electrode assembly 20 is conditioned or coated in such a manner that electrons in the plasma and/or sheath are reflected, emitted, etc. to equalize discontinuities in the plasma. The conditioning embodiments are illustrated in FIGS. 16 and 17.

FIG. 9 illustrates the first embodiment of inserted embodiment of tuning element, in which a buried element 60 is inserted in said electrode assembly 20. The buried element 60 is generally annular (even though it may be formed in distinct radial elements), and is positioned below and in close proximity to the peripheral workpiece edge 54. All tuning elements which rely upon buried elements are inherently of the inserted type. The buried element 60 of FIG. 9 contains a first portion 62 which is below and inside of the applicable workpiece edge 54, and a second portion 64 which is below and outside of the workpiece edge 54. The buried element 60 has an upper surface 66 which is buried at a depth 68. The buried element itself has a thickness 70. The buried element may be formed from any material which is capable of altering the capacitance of the electrode assembly (which may or may not include the electrostatic chuck 38), but the combinations of a teflon (which is a trademark of the Dupont Company of Wilmington Del.) buried element in a quartz electrode assembly, or an aluminum buried element in a quartz electrode assembly, has been found to function. The buried element may be active or passive. Modifications to the material and configuration of the buried element will produce considerably different effects on the plasma. It will therefore be desirable to alter the configuration of the buried elements based upon the specific workpiece. Configuring the buried elements for the specific workpiece is largely empirical in nature, and the knowledge of which is increasing with more research being conducted in this area.

It is typically relatively easy to configure a buried element to a workpiece sufficiently well to provide for a reasonably regular plasma gradient configuration. FIGS. 10a, 10b, 10c, 10d, and 10e represent different cross sectional configurations of buried elements 60 contained within the electrode assembly 20. It is also possible that, and the present disclosure covers, buried elements to be formed as a portion of the electrostatic chuck 38 (not illustrated). It is preferable to have the buried elements actually buried in the electrode assembly 20, as illustrated in FIGS. 9 and 10, since it has been found that surface elements (buried elements which are exposed to the plasma) can provide another vehicle for producing impurities or alter the physics and chemistry of the plasma.

In this disclosure, the term "passive" when referring to the buried elements 60 is defined such that the potential effect from the buried element on the plasma is substantially unchanging with time; this results from the buried element being substantially constant in configuration, position and composition over time. "Active" buried elements, by comparison, are defined as being configured to change with respect to time, as may be controlled by the user. The passive buried element in FIG. 8 operates by modifying the capacitive effect of the electrode assembly 20 (which may or may not include the electrostatic chuck 38) onto the plasma. This alteration of the capacitive effect is sufficient to alter the potential gradient of the plasma.

FIG. 11 illustrates the effect on the plasma of applying a buried element 60 within the electrode assembly 20. The first curve (which follows the triangular symbols) represents the etch depth of an silicon dioxide film with an uncompensated electrode assembly. The downward deflection of the curve, near the edges of the wafer, represents the non-uniformity in the etch depth. The second curve, illustrated by the circular symbols, indicates the effects of the buried sublayers on etch depth uniformity. The uniformity on the left is vastly improved (more horizontal) with the inclusion of a buried teflon sub-layer illustrated. On the right, aluminum was used as a buried sublayer. The aluminum sublayer represents a poor choice of compensation in this case since the uniformity was not substantially affected. The effectiveness of the inserted material in the electrode may alter depending upon the configuration and materials used in the electrode assembly, and other variables.

FIG. 12 illustrates one embodiment of active buried element 80. The active buried element 80 of this embodiment actually includes a first portion 82 and a second portion 84. The active buried element 80 typically is formed from similar materials as the active, buried elements of FIG. 10, and each of the FIG. 10 buried elements 60. What causes the buried element 80 to be active is that the relative position of the first portion 82 may be altered with respect to the Second portion 84, which results from the action of a piezoelectric driver 86; whose operation is well known in the art and may be controlled remotely by a human operator or programmed by a computer. Altering the relative positions of the first portion 82 and the second portion 84 will result in a different capacitive effect being produced between the electrode assembly 20 and the plasma 26, and will thereupon result in differences in the plasma above, as well. One major advantage of this embodiment is that the effect of the buried element 80 may be varied (altering the plasma configuration) during plasma processing which occurs inside a vacuum. Alternately, the configuration of the electrostatic chuck 38 may be altered by using a piezoelectric driver, resulting in a similar plasma modification. While this embodiment is not illustrated, it would be understood to one having ordinary skill in the art.

Another configuration of active buried element 90 is illustrated in FIG. 13 in which variation of the capacitive effects (between the electrode assembly and the plasma) is produced by the active buried element 90, and is at least partially caused by modification of a potential supplied from a potential source (a plurality of potential sources 92a and 92b are illustrated in FIG. 13) which is electrically connected to the active buried element 90. The active buried element 90 in FIG. 13 may be formed from the same material as that described in FIG. 9. However the fact that an external power source (the potential sources 92a and 92b) is applied directly to the active buried element will provide a buried element which is generally capable of producing a stronger effect on the plasma potential gradient than the passive embodiments of buried elements which rely on capacitance changes in the electrode assembly as described above. The spatial variation may also be obtained by other techniques, e.g. filters, by one having ordinary skill in the art.

The FIG. 13 embodiment of the present invention may be automated, as illustrated in FIG. 13a, by the inclusion of sensors 95 (e.g. optical, electromagnetic, electrical, etc.) which determine the actual plasma parameter (e.g. potential, density, emissions, etc.) levels in specific regions. The plasma parameter levels are input into an electronic controller 96 which regulates the potential level supplied to the buried elements 90. The addition of microelectronic control devices, and sensor elements, as envisioned in the FIG. 13a embodiment are well known in the art and will not be further detailed herein.

In an alternate embodiment illustrated in FIG. 18, which is very similar to the embodiment illustrated in FIG. 9, a distinct primary plasma source 150 is applied above the location where the plasma is to be formed. In the FIG. 18 embodiment, the primary plasma source 150 produces the plasma while the electrode assembly (including the buried elements) act to modify the plasma. In the FIG. 9 embodiment, by comparison, the electrode assembly forms the plasma. The FIG. 18 embodiment is included to illustrate that the elements of the present invention can be used to modify the plasma as well as to form the plasma.

While the above embodiments of buried elements have been illustrated as being physically buried within the electrode assembly 20, it is within the scope of the present invention that the buried elements are in contact with the surface of, or actually above the surface of the electrode assembly 20. However, it is desirable to maintain a boundary between the buried elements and the plasma to minimize contaminant produced therefrom. This is especially significant in cases such as where the workplace 22 is a semiconductor chip, or other electronic device which can be significantly affected by contamination. Contamination to the workpiece typically occurs after the plasma operation is extinguished, and the particles which have been suspended over the workpiece by the electric field set up by the electrode assembly 20 unavoidably settle onto the workpiece 22.

In another embodiment illustrated in FIG. 19, the buried element may be encapsulated within the clamp ring 32.

Similarly, the buried element may be contained within a so called focus ring or collar 125. The focus ring (which is a different name for a collar) is structurally identical to the clamp ring, except that the clamp ring is secured to a part of the electrode assembly 20, and effectively secures the workpiece 22 to the electrode assembly 20. The focus ring lies on top of, or adjacent to, the workpiece and is not necessarily secured to the electrode. The primary purpose of the focus ring 125 is to alter the plasma adjacent the workpiece. It is envisioned that the buried element may be located within the focus ring, as illustrated in FIG. 19, or may simply lie between the focus ring and the remainder of the electrode assembly.

In an alternate embodiment of the invention, as illustrated in FIGS. 14 and 15, a nominally uniform plasma is intentionally distorted during the final period of plasma processing by the addition of a time varying electric pulse being applied to the buried element by a power source. This helps to drive any suspended particles 98, which collect above the workpiece, away from the workpiece prior to the end of the processing (and the resulting removal of the electric charge), to decrease the impurities which the wafer is exposed to. The pump ports 97 for the process chamber will be able to remove those particles which have been driven in a direction away from the area of the workpiece by suction, as indicated by the arrow 109. In a related manner, the buried elements may be used to provide some non-uniformity in the plasma (not only to produce a more uniform plasma).

FIG. 16 illustrates the first embodiment of tuning element of the present invention which is characterized as a conditioning embodiment. In this embodiment, the tuning of the plasma is provided by the reflective or emissive electron characteristics of the surface 100 of the electrode assembly 20. Specifically, if the plasma above the electrode assembly surface 102 which is not covered by the workpiece 22 has a higher plasma density and/or emission than the region above the workpiece surface, the surface 102 is roughened to lower the electron emission and/or electron reflection coefficient which will tend to decrease plasma density and/or emission above the non-covered surface 102. Therefore, plasma will be radially more uniform (in situations where the plasma density is too low above a particular surface, modifications to that surface to increase the secondary electron emission and/or electron reflection are appropriate). The secondary electron emission coefficient and the electron recombination coefficient represent the two primary mechanisms by which roughening the surface effects the transmitters of the electrons.

While the FIG. 16 embodiment utilizes roughened and smoothed surface to adjust the reflectivity and/or emissivity of the electrons which are in contact with surface 100 of the electrode assembly 20, the same effect will result in the FIG. 16 embodiment where the surface 100 is coated with different coatings which illustrate similar reflective/emissive characteristics as that in the FIG. 16 embodiment. Any method which results in different transmissions of electrons based upon the mechanisms described in the FIG. 16 embodiment, from the plasma to the electrode assembly is within the scope of the conditioning embodiments of the tuning elements of the present invention. While the FIGS. 16 and 17 embodiments illustrate two of the better understood surface electrode modifications, any other known surface modification which functions similarly to as described with respect to these two embodiments are within the scope of the prior art. It is also possible to provide a workpiece 22 which, itself, has altered reflective emissive characteristics in order to provide an altered plasma.

FIG. 17 illustrates what a dramatic effect roughening the surface of the electrode assembly 20 can have on the plasma. In FIG. 17, the portions of the plasma emission (and consequently plasma potential) levels above a roughened surface 120 are different than the levels above a smooth surface 122 (even though both the roughened surface 120 and the smooth surface 122 are constructed from similar materials, and thus the chemical properties of the two surfaces are the same).

It is to be understood that the application of buried structures in the electrode to equalize and regulate the plasma uniformity is within the scope of the present invention whatever the plasma may be used for. This present disclosure has described plasmas applied to workpieces secured with clamps or electrostatic chucks, but the present plasma regulating process may also be applied to any other plasma application utilizing workpieces and/or electrodes which produce plasma irregularities.

While the above devices for altering the potential of different portions of the plasma have been described in the alternative, it is to be understood that these devices may be used in combination, as appropriate, and the combination of these devices is also within the scope of the present invention. It is not necessary that the buried element be formed as a separate element from the electrostatic chuck, as described in the above embodiments. It is possible that the buried element be formed as part of the electrostatic chuck, the clamp ring, or the focus ring, and as such, the required delineation between the electrostatic chuck, the clamp ring or the focus ring and the buried elements become somewhat blurred.

We claim:

1. An apparatus for controlling plasma irregularities, that are created in a local region of an otherwise substantially uniform plasma formed above, and being applied to, the surface of a workpiece, and that result from the local presence of said workpiece, comprising:

an electrode assembly, having a surface in contact with said workpiece, capable of applying an electric potential to said plasma, said electrode assembly comprising:

means for applying an AC potential to said plasma to produce a substantially uniform AC field therein; and means for controlling the plasma irregularities in said local region, said controlling means comprising:

means, disposed in said electrode assembly in the vicinity of said local region and out of direct electrical contact with said workpiece and said plasma, for modifying said electrical potential at said local region to control the plasma irregularities therein without otherwise effecting said substantially uniform plasma formed above said surface of said workpiece, said modifying means comprising:

a buried element in said electrode assembly;

means for applying a potential to said buried element in said electrode assembly to render said buried element active and means for making the potential applied to said buried element variable to cause said active buried element to interact with said AC field to produce an AC time varying potential for modifying said electrical potential at said local region.

2. The apparatus as described in claim 1, wherein said buried element is a portion of an electrostatic chuck.

3. The apparatus as described in claim 1 wherein said potential applying means and said means for making the potential variable comprise means for applying a radio frequency potential to said buried element whereby said buried element affects a radio frequency coupling between the electrode assembly and the plasma.

4. The apparatus as described in claim 1, wherein said workpiece has an edge adjacent said local region and said buried element is contained within said surface of the electrode assembly and disposed near the edge of said workpiece in the vicinity of said local region.

5. The apparatus as described in claim 4, wherein said potential applying means and said means for making the potential variable comprise means for applying a radio frequency potential to said buried element whereby said buried element affects a radio frequency coupling between the electrode assembly and the plasma creating a substantially uniform trap-limited plasma above the electrode assembly in said local region.

6. The apparatus as described in claim 4, wherein said buried element is disposed in said electrode assembly so as to affect capacitance between the electrode assembly and the plasma.

7. The apparatus as described in claim 1, wherein said buried element is disposed in said electrode assembly so as to affect capacitance between the electrode assembly and the plasma.

8. The apparatus as described in claim 7, wherein said potential applying means and said means for making the potential variable comprise means for applying a radio frequency potential to said buried element and said buried element is disposed in said electrode assembly so as to affect a radio frequency coupling between the electrode assembly and the plasma, thereby producing said AC time varying potential and achieving a desired variation of the plasma properties.

9. The apparatus as described in claim 1, wherein said means for making said potential variable comprises:
pulse means for creating an electrical pulse which is capable of driving particles that are suspended in the plasma in the vicinity of the workpiece away from the workpiece.

10. An apparatus for controlling plasma irregularities, that are created in a local region of an otherwise substantially uniform plasma formed above, and being applied to, the surface of a workpiece, and that result from the local presence of said workpiece, comprising:
an electrode assembly, having a surface in contact with said workpiece, capable of applying an electric potential to said plasma, said electrode assembly comprising:
means for applying an AC potential to said plasma to produce a substantially uniform AC field therein; and
means for controlling the plasma irregularities in said local region, said controlling means comprising:
means, disposed in said electrode assembly in the vicinity of said local region and out of direct electrical contact with said workpiece and said plasma, for modifying said electrical potential at said local region to control the plasma irregularities therein without otherwise effecting said substantially uniform plasma formed above said surface of said workpiece, wherein said modifying means comprises:
a plurality of electrically isolated sections in said surface of said electrode assembly, which sections are capable of being powered independently; and
means for applying different time varying potentials to different sections to cause the potentials at said sections to interact with said AC field to produce an AC time varying potential for modifying said electrical potential at said local region.

11. An apparatus for controlling plasma irregularities, that are created in a local region of an otherwise substantially uniform plasma formed above, and being applied to, the surface of a workpiece, and that result from the local presence of said workpiece, comprising:
an electrode assembly, having a surface in contact with said workpiece, capable of applying an electric potential to said plasma, said electrode assembly comprising:
means for applying an AC potential to said plasma to produce a substantially uniform AC field therein and
means for controlling the plasma irregularities in said local region, said controlling means comprising:
means, disposed in said electrode assembly in the vicinity of said local region and out of direct electrical contact with said workpiece and said plasma, for modifying said electrical potential at said local region to control the plasma irregularities therein without otherwise effecting said substantially uniform plasma formed above said surface of said workpiece, wherein said modifying means comprises:
externally and independently controllable power distribution elements for in-process programmable, or feed back controlled tuning of the plasma field uniformity using time varying potentials applied to said distribution elements to cause the potentials at said elements to interact with said AC field to produce an AC time varying potential for modifying said electrical potential at said local region.

12. An apparatus for controlling plasma irregularities, that are created in a local region of an otherwise substantially uniform plasma formed above, and being applied to, the surface of a workpiece, and that result from the local presence of said workpiece, comprising:
an electrode assembly, having a surface in contact with said workpiece, capable of applying an electric potential to said plasma, said electrode assembly comprising:
means for applying an AC potential to said plasma to produce a substantially uniform AC field therein; and
means for controlling the plasma irregularities in said local region, said controlling means comprising:
means, disposed in said electrode assembly in the vicinity of said local region and out of direct electrical contact with said workpiece and said plasma, for modifying said electrical potential at said local region to control the plasma irregularities therein without otherwise effecting said substantially uniform plasma formed above said surface of said workpiece, wherein said modifying means comprises:
independently tuned power distribution elements for in-process, programmable, or feed back controlled tuning of the plasma field uniformity using time varying potentials applied to said distribution elements to cause the potentials at said elements to interact with said AC field to produce an AC time varying potential for modifying said electrical potential at said local region.

13. An apparatus for controlling plasma irregularities, that are created in a local region of an otherwise substantially uniform plasma formed above, and being applied to, the surface of a workpiece, and that result from the local presence of said workpiece, comprising:
an electrode assembly, having a surface in contact with said workpiece, capable of applying an electric potential to said plasma, said electrode assembly comprising:

means for applying an AC potential to said plasma to produce a substantially uniform AC field therein; and means for controlling the plasma irregularities in said local region, said controlling means comprising:

means, disposed in said electrode assembly in the vicinity of said local region and out of direct electrical contact with said workpiece and said plasma, for modifying said electrical potential at said local region to control the plasma irregularities therein without otherwise effecting said substantially uniform plasma formed above said surface of said workpiece, wherein said modifying means comprises:

sublayer elements contained in the electrode assembly and independently powered for in-process, programmable, or feed-back controlled tuning of the plasma field uniformity using time varying potentials applied to said sublayer elements to cause the potentials at said elements to interact with said AC field to produce an AC time varying potential for modifying said electrical potential at said local region.

14. An apparatus for controlling plasma irregularities, that are created in a local region of an otherwise substantially uniform plasma formed above, and being applied to, the surface of a workpiece, and that result from the local presence of said workpiece, comprising:

an electrode assembly, having a surface in contact with said workpiece, capable of applying an electric potential to said plasma, said electrode assembly comprising:

means for applying an AC potential to said plasma to produce a substantially uniform AC field therein; and means for controlling the plasma irregularities in said local region, said controlling means comprising:

means, disposed in said electrode assembly in the vicinity of said local region and out of direct electrical contact with said workpiece and said plasma, for modifying said electrical potential at said local region to control the plasma irregularities therein without otherwise effecting said substantially uniform plasma formed above said surface of said workpiece, wherein said modifying means comprises:

plasma field control means independently powered for creating a potential gradient capable of driving particles that are suspended in the plasma in the vicinity of the workpiece away from the workpiece, after said plasma is active using time varying potentials applied to said control means to cause the potentials at said control means to interact with said AC field to produce an AC time varying potential for modifying said electrical potential at said local region.

15. An apparatus for controlling irregularities in a plasma created above and being applied to the surface of a workpiece, which irregularities are caused in a local region of the otherwise substantially uniform plasma by the presence of said workpiece at said local region, comprising:

an electrode assembly for supporting said workpiece in said plasma, wherein said electrode assembly comprises:

means for applying an AC potential to said plasma to produce an AC field that causes a uniformity in said plasma above the surface of said workpiece; and means, disposed in said electrode assembly in the vicinity of said local region, out of direct electrical contact with said workpiece and said plasma, and having a time varying potential applied thereto to cause interaction with said AC field, for modifying said AC potential in said local region at said workpiece to control irregularities in said plasma in said local region caused by the presence of said workpiece without otherwise effecting said substantially uniform plasma above said surface of said workpiece.

16. The apparatus of claim 15, wherein said modifying means comprises a member disposed in said electrode assembly below a portion of said surface for supporting said workpiece in the vicinity of said local region.

17. The apparatus of claim 16, further comprising means for applying a time varying potential and wherein said time varying potential applying means comprises means for applying a potential to said member.

18. The apparatus of claim 17, wherein said means for applying a time varying potential applies an AC potential to said member.

19. The apparatus of claim 15, wherein said modifying means comprises means, connected to said potential applying means for affecting a radio frequency coupling between the electrode assembly and the plasma in said local region.

20. The apparatus of claim 15, wherein said modifying means produces a substantially uniform trap-limited plasma at said surface of the workpiece in said local region.

21. The apparatus of claim 15, wherein said modifying means affects capacitance between the electrode assembly and the plasma in said local region.

22. The apparatus of claim 15, wherein said modifying means comprises a plurality of electrically isolated sections in said electrode assembly surface, and said potential applying means comprises means for independently applying a potential to said sections.

23. The apparatus of claim 15, wherein said modifying means comprises externally controllable power distribution elements in the vicinity of said local region for tuning the plasma field uniformity in said local region.

24. The apparatus of claim 15, wherein said modifying means comprises plasma field control means for creating a potential gradient capable of driving particles, that are suspended in the plasma in the vicinity of the workpiece, away from the workpiece in said local region, after said plasma is active.

25. The apparatus of claim 15, wherein said modifying means further comprises pulse means for creating an electrical pulse which is capable of driving particles, that are suspended in the plasma in the vicinity of the workpiece, away from the workpiece in said local region.

26. The apparatus of claim 15, wherein said modifying means comprises a surface which is configured differently in distinct regions, to control the rate of the passage of electrons thereto from said plasma per given area, at the distinct regions.

27. The apparatus of claim 26, wherein said surface configuring is achieved by varying the roughness of the distinct regions of said surface.

28. The apparatus of claim 26, wherein said surface configuring is achieved by coating the distinct regions of said surface differently.

29. The apparatus of claim 15, wherein said modifying means comprises means for controlling plasma irregularities in said local region by altering a secondary electron emission coefficient of a surface adjacent said plasma in the vicinity of said local region.

30. The apparatus of claim 15, wherein said modifying means comprises means for controlling plasma irregularities in said local region by altering an electron reflection coefficient of a surface adjacent said plasma in the vicinity of said local region.

* * * * *